(12) United States Patent
Osaka et al.

(10) Patent No.: US 9,531,040 B2
(45) Date of Patent: Dec. 27, 2016

(54) BATTERY SYSTEM AND METHOD FOR EVALUATING BATTERY SYSTEM

(71) Applicant: WASEDA UNIVERSITY, Tokyo (JP)

(72) Inventors: Tetsuya Osaka, Tokyo (JP); Toshiyuki Momma, Tokyo (JP); Tokihiko Yokoshima, Tokyo (JP); Daikichi Mukoyama, Tokyo (JP); Hiroki Nara, Tokyo (JP)

(73) Assignee: WASEDA UNIVERSITY, Tokyo (JP)

( * ) Notice: Subject to any disclaimer, the term of this patent is extended or adjusted under 35 U.S.C. 154(b) by 19 days.

(21) Appl. No.: 14/433,447

(22) PCT Filed: Oct. 4, 2013

(86) PCT No.: PCT/JP2013/077136
§ 371 (c)(1),
(2) Date: Apr. 3, 2015

(87) PCT Pub. No.: WO2014/054796
PCT Pub. Date: Apr. 10, 2014

(65) Prior Publication Data
US 2015/0303533 A1    Oct. 22, 2015

(30) Foreign Application Priority Data

Oct. 5, 2012  (JP) ................................. 2012-223124

(51) Int. Cl.
*H01M 10/48*    (2006.01)
*G01R 31/36*    (2006.01)
(Continued)

(52) U.S. Cl.
CPC ........ *H01M 10/486* (2013.01); *G01R 31/3651* (2013.01); *G01R 31/3662* (2013.01);
(Continued)

(58) Field of Classification Search
CPC ............ G01R 31/3651; G01R 31/3662; G01R 31/3675; G01R 31/3679; H01M 10/0525; H01M 10/4207; H01M 10/482; H01M 10/486
See application file for complete search history.

(56) References Cited

U.S. PATENT DOCUMENTS

2011/0031048 A1 *   2/2011   Ohkura .............. G01R 31/3658
                                                        180/65.1

FOREIGN PATENT DOCUMENTS

| JP | 08-043507 A    | 2/1996 |
| JP | 2009-097878 A  | 5/2009 |
| JP | 2011-038857 A  | 2/2011 |

OTHER PUBLICATIONS

International Search Report dated Jan. 14, 2014 issued in PCT/JP2013/077136.

* cited by examiner

*Primary Examiner* — Patrick Ryan
*Assistant Examiner* — Ben Lewis
(74) *Attorney, Agent, or Firm* — Scully, Scott, Murphy & Presser, P.C.

(57) ABSTRACT

A battery system includes: a secondary battery; a memory portion that stores information which includes a measurement frequency, a measurement temperature, and an initial limiting capacitance of one secondary battery; a temperature measuring section; a power supply section which applies an AC signal of 0.5 mHz to 10 mHz, to the secondary battery at 40° C. to 70° C.; a measuring portion which measures an impedance of the secondary battery by the AC signal; and a calculating portion that calculates the degree of degradation of the secondary battery.

5 Claims, 7 Drawing Sheets

(51) Int. Cl.
*H01M 10/42* (2006.01)
*H01M 10/0525* (2010.01)

(52) U.S. Cl.
CPC ..... *G01R 31/3675* (2013.01); *G01R 31/3679* (2013.01); *H01M 10/4207* (2013.01); *H01M 10/482* (2013.01); *H01M 10/0525* (2013.01)

BATTERY SYSTEM AND METHOD FOR EVALUATING BATTERY SYSTEM

TECHNICAL FIELD

An embodiment of the present invention relates to a battery system having a secondary battery, and a method for evaluating the battery system.

BACKGROUND ART

A secondary battery is used in portable devices, electric power tools, electric vehicles and the like. A lithium ion battery out of the secondary batteries has features of showing high operation voltage, easily providing a high output and besides having high energy density, because an ionization tendency of lithium is large. Furthermore, the lithium ion battery is also expected to be applied to a large-sized power supply such as a stationary power supply and a stand-by power supply.

Here, an alternating current impedance method is known, as a method for measuring characteristics of the secondary battery such as the lithium ion battery. For instance, Japanese Patent Application Laid-Open Publication No. 2009-97878 discloses a measurement method which analyzes a Nyquist plot that has been acquired by the alternating current impedance method, by using an equivalent circuit model.

In addition, Japanese Patent Application Laid-Open Publication No. H08-43507 discloses a method of simply estimating a degraded state or the capacity of the measured battery, by specifying a frequency at which there is a high correlation between impedance and a battery capacity.

Figure 1:
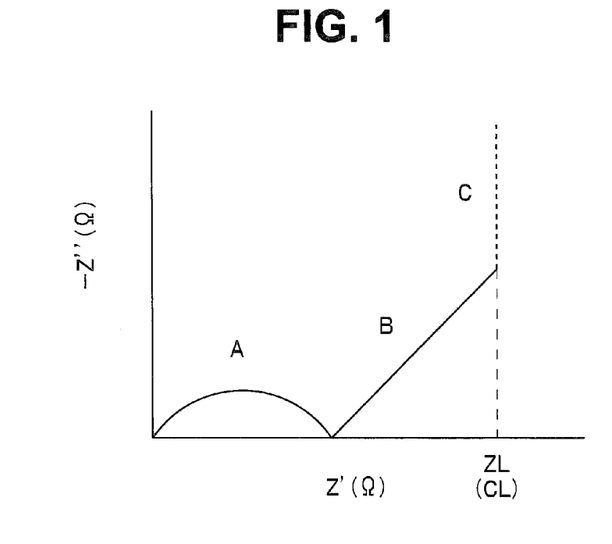
FIG. 1 is a view showing a Nyquist plot.

As is shown in FIG. 1, when a measurement frequency is scanned from a high-frequency side to a low-frequency side in the alternating current impedance method, a trajectory A of the impedance, which draws a semicircle clockwise, is obtained as a Nyquist plot. The trajectory A is generated by influences of a solution resistance of the battery, a charge transfer resistance and an electric double layer capacitor. The battery has two electrodes (positive electrode and negative electrode), and accordingly the trajectory A becomes a trajectory in which at least two semicircles overlap one another. When the trajectory A is analyzed using the equivalent circuit model, characteristics of each component of the electrodes, the electrolyte and the like can be grasped which constitute the battery.

When the frequency is further lowered, a trajectory B is obtained which is a straight line having a gradient of approximately 45 degrees. The trajectory B is a Warburg impedance which is generated by an influence of ion diffusion.

Here, when the measurement frequency is lowered than that of the trajectory B, a trajectory C is obtained which is perpendicular to a Z' (real number impedance) axis. The perpendicular trajectory C is in a state of showing a capacitive component which does not depend on an internal resistance. That is, a limiting capacitance CL (limiting impedance ZL) which has a correlation with the capacity of the battery can be easily acquired from the trajectory C. The change of an active material of the battery, that is, a degradation of the battery caused by the usage count (number of charge and discharge cycles) can be diagnosed directly from a relative value between the measured limiting capacitance CL and an initial limiting capacitance (for instance, ratio between both capacitances).

However, in order to analyze the trajectory A by using the equivalent circuit model, an expensive apparatus has been needed. On the other hand, the frequency at which the trajectory C appears is as extremely low as 0.1 mHz or less, for instance, and accordingly a long time period is required in order to acquire the limiting capacitance CL. For instance, in order to measure the capacitance at the frequency of 0.1 mHz, approximately 170 minutes are required. Furthermore, in order to obtain a result with higher accuracy, the capacitance is measured while the frequency is varied around a predetermined frequency. For this reason, it has not been easy for a user to measure the degree of degradation of the battery while the battery is used.

DISCLOSURE OF INVENTION

An object of the embodiment of the present invention is to provide a battery system that can easily measure the change of a state, which accompanies the use and a change with time of a secondary battery, and to provide a method for evaluating the battery system, which can easily measure the change of the state.

Means for Solving the Problem

A battery system according to the embodiment of the present invention includes: a secondary battery, a degree of degradation of which is measured; a memory portion that stores specific information which includes a measurement frequency, a measurement temperature, and an initial limiting capacitance of one secondary battery having the same specification as a specification of the secondary battery; a temperature measuring section which measures a temperature of the secondary battery; a power supply section which applies an alternating current signal having the measurement frequency of 0.5 mHz or more but less than 10 mHz, to the secondary battery at the measurement temperature of 40° C. or higher but 70° C. or lower, based on the information in the memory portion; a measuring portion which measures an impedance of the secondary battery by the alternating current signal that the power supply section applies; and a calculating portion that calculates the degree of degradation by using a limiting capacitance of the secondary battery, which is calculated using a measurement value of the measuring portion, and the initial limiting capacitance.

A method for evaluating a secondary battery according to another embodiment includes steps of: manufacturing a plurality of battery systems which are provided with secondary batteries, respectively; measuring an initial limiting capacitance of one of the secondary batteries, at a measurement temperature of 40° C. or higher but 70° C. or lower; storing specific information which includes a measurement frequency, the measurement temperature and the initial limiting capacitance, in a memory portion of the battery system; heating the secondary battery of the battery system to the measurement temperature; applying an alternating current signal having the measurement frequency of 0.5 mHz or more but less than 10 mHz, to the secondary battery at the measurement temperature, and measuring an impedance of the secondary battery; and calculating a degree of degradation by using a limiting capacitance of the secondary battery, which is calculated using the impedance, and the initial limiting capacitance.

Advantageous Effects of Invention

The embodiment of the present invention can provide the battery system which can easily measure the degree of degradation of the secondary battery, and the method for evaluating the secondary battery, which can easily measure the degree of degradation.

BEST MODE FOR CARRYING OUT THE INVENTION

Figure 2:
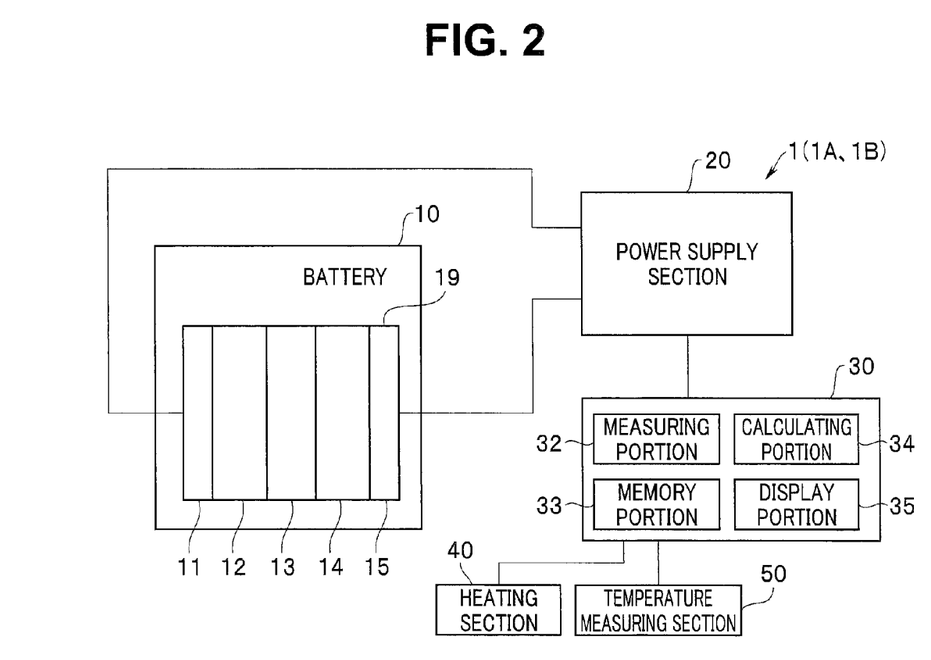
FIG. 2 is a configuration diagram of a battery system of a first embodiment.

<First Embodiment>
<Configuration of Battery System>
As is shown in Fig. 2, a battery system 1 of a first embodiment is provided with: a lithium ion secondary battery (hereinafter referred to as "battery") 10; a power supply section 20; a control section 30; a heating section 40 which heats the battery 10; and a temperature measuring section 50 which measures the temperature of the battery 10.

The battery 10 has a unit cell 19 which is formed of: a positive electrode 11 that occludes/emits a lithium ion; electrolytes 12 and 14; a separator 13; and a negative electrode 15 that occludes/emits the lithium ion. Note that the battery 10 may have a plurality of unit cells 19, and may also have a plurality of units which are formed of the plurality of unit cells. Alternatively, the positive electrode 11 may lithiate/delithiate lithium, and the negative electrode 15 may lithiate/delithiate lithium.

The positive electrode 11 of the battery 10 contains, for instance, a lithium cobalt oxide; the negative electrode 15 contains, for instance, a carbon material; and the separator 13 is formed of, for instance, polyolefin. The electrolytes 12 and 14 are electrolytes which contain, for instance, LiPF6 dissolved in cyclic and chain carbonates. Note that the battery may have such a structure that the inside of the separator which is formed of a porous substance and the like is filled with the electrolyte. The electrolyte may be a solid electrolyte or a gel electrolyte. In addition, when the solid electrolyte or the like is used as the electrolyte, the separator may be eliminated.

Note that the battery 10 shown in FIG. 1 is a schematic view, and the structure of the unit cell 19 may be various types of known structures, for instance, a wound type cell, a coin type cell, or a laminate cell. Furthermore, the materials of the positive electrode 11, the negative electrode 15, the electrolytes 12 and 14, the separator 13 and the like are also not limited to the above described materials, and various types of known materials can be used.

The control section 30 has a measuring portion 32, a memory portion 33, a calculating portion 34, and a display portion 35. The memory portion 33 stores specific information on a battery having the same specification as that of the battery 10, which includes an initial limiting capacitance CL0, a measurement temperature and a measurement frequency. That is, the memory portions 33 in the plurality of battery systems 1 each having the same specification store the same specific information, at the time of shipment.

The initial limiting capacitance CL0 is a limiting capacitance at an initial stage (time when use starts), which becomes a reference in a calculation of the degree of degradation. The power supply section 20 applies an alternating current signal having the measurement frequency which is stored in the memory portion 33, to the battery 10. The heating section 40 heats the temperature of the battery 10, which is measured by the temperature measuring section 50 during the impedance measurement, to a predetermined measurement temperature. The measuring portion 32 measures the impedance of the battery 10 from the alternating current signal which the power supply section 20 has applied to the battery 10 at the measurement temperature. The calculating portion 34 calculates the degree of degradation of the battery 10, from the impedance of the battery 10, which the measuring portion 32 has measured and the specific information on the battery 10.

The display portion 35 displays the calculated result in the calculating portion 34, in a form which a user can recognize. Note that in a case or the like where the battery system 1 is used as a part of another system, if a user can recognize the calculated result by using a display function of another system, for example, the display portion 35 is unnecessary. In addition, when the temperature at which the battery is submitted to measurement becomes the measurement temperature even though the battery is not heated, the heating section 40 is unnecessary. Furthermore, in the case, for example, where the battery system 1 is used as a part of another system, if another system has a temperature measuring function of measuring the temperature in the vicinity of the battery 10, the temperature measuring section 50 is occasionally unnecessary. In addition, two or more portions out of the measuring portion 32, the memory portion 33 and the calculating portion 34 in the control section 30 may be formed of the same CPU or the like.

<Alternating Current Impedance Method>
Here, an alternating current impedance method will be described in detail below. In the alternating current impedance method, a voltage formed of a fine alternating current voltage superimposed on a direct current voltage is applied to a battery to be measured, and the impedance is measured from response characteristics.

The direct current voltage component of the signal to be applied can be appropriately set, but is preferably set at approximately the voltage of the battery to be measured. For instance, in a case of the lithium secondary battery, the voltage is approximately 3.7 V. The voltage of the battery varies depending on a state of charge, and accordingly is desirably measured before the measurement of the alternating current impedance. Note that a constant current impedance measurement is also possible. In addition, an alternating current voltage component to be superimposed is set at such a degree of voltage as not to give an influence on the characteristics of the battery. Note that the alternating current voltage component to be superimposed may employ an alternating current which is set at such a degree of voltage as not to give an influence on the characteristics of the battery.

In the alternating current impedance method, the frequency of the alternating current voltage is swept from a high frequency to a low frequency, and the impedance of the battery in each of the frequencies is measured at predetermined frequency intervals. Note that it is preferable that the measurement frequencies be set at equal intervals in terms of logarithm. The frequency of the alternating current voltage may also be swept from the low frequency to the high frequency.

The alternating current impedance of one battery having the same specification as that of the battery 10 is measured, for instance, on the following conditions.

Measurement range of frequency: 100 kHz to 1 mHz
Voltage amplitude: 5 mV
Direct current voltage: 3.7 V
Temperature: 25° C. (no heating): 40° C., 50° C. and 60° C.
SOC (state of charge) at 50%

The frequency characteristics of the measured impedance can be shown by a complex plan view in which a Z' (real number impedance) axis is shown as a resistance component, and a Z" (imaginary number impedance) axis is shown as a reactance component (usually, capacitive component). The scales of the Z' axis and the Z" axis in the complex plan view are the same. The trajectory of the impedance which is shown in the complex plan view is the Nyquist plot.

Figure 3:
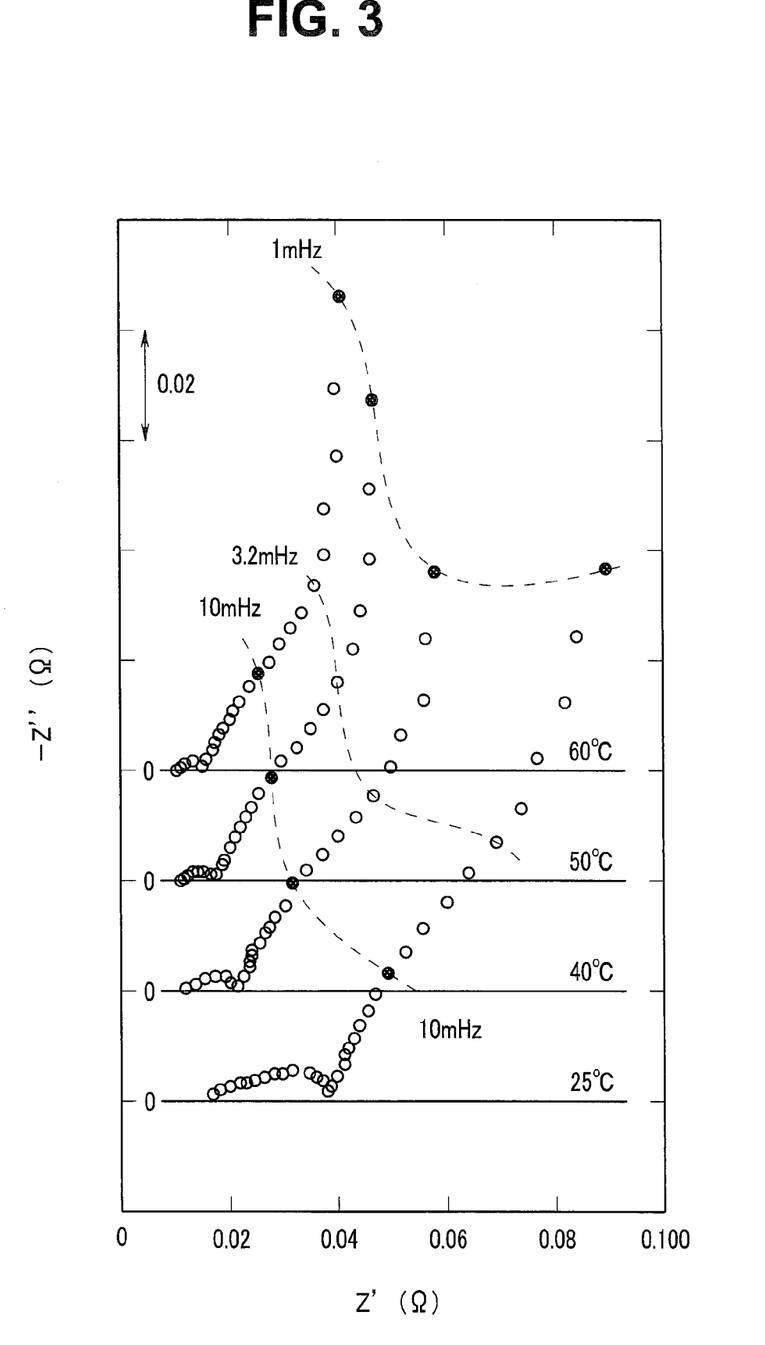
FIG. 3 is a measurement example of the Nyquist plot.

As is shown in FIG. 3, when the measurement frequency is changed from the high frequency to the low frequency, a trajectory of the impedance which includes a clockwise semicircle, and a trajectory having a gradient of 45 degrees are obtained. However, when the measurement temperature is 25° C., even though the frequency is less than 10 mHz, the trajectory does not become perpendicular to the Z' axis. In contrast to this, when the measurement temperature is 40° C. or higher, even though the frequency is less than 10 mHz, in particular, less than 3 mHz, the trajectory of the impedance becomes approximately perpendicular to the Z' axis. From the trajectory, a limiting impedance ZL (limiting capacitance CL) of the battery can be acquired.

That is, when the battery 10 is heated to the temperature of 40° C. or higher, even though the alternating current signal has a comparatively high frequency of 0.5 mHz or more but less than 10 mHz, the limiting capacitance CL which depends only on the capacitive component of the battery 10 can be acquired. The measurement time period has been approximately 170 minutes when the measurement frequency is 0.1 mHz, but is 30 minutes when the measurement frequency is 0.5 mHz, is 20 minutes when the measurement frequency is 1 mHz, and can be shortened to 2 minutes when the measurement frequency is 0.1 mHz.

Figure 4:
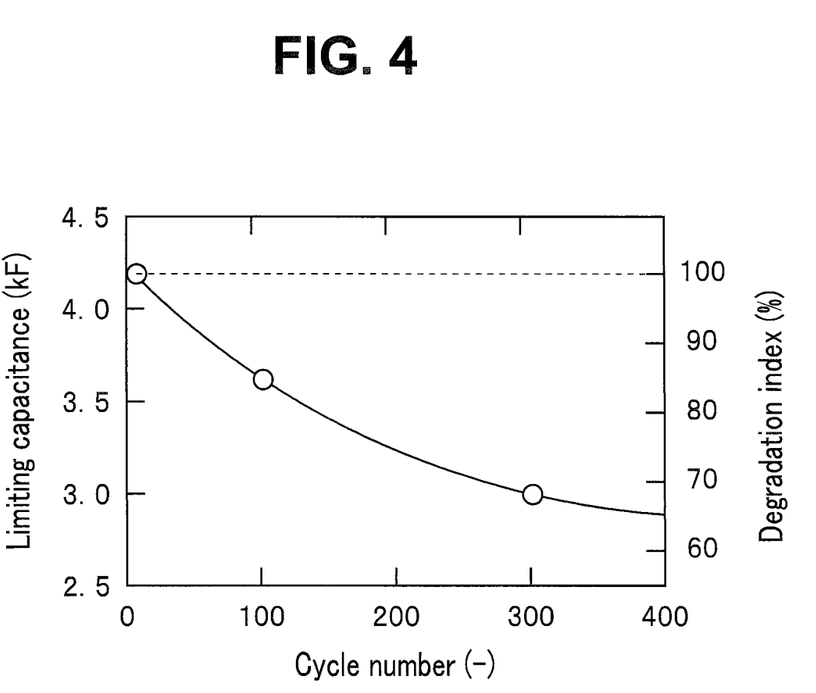
FIG. 4 is a view showing a relationship between a number of charge and discharge cycles and a limiting capacitance (degradation index)

As is shown in FIG. 4, when the number of charge and discharge cycles has increased, the limiting capacitance CL decreases which has a correlation with the capacitance of the battery 10. Because of this, the degree of degradation of the battery can be shown, for instance, as a degradation index, which is a ratio between the initial limiting capacitance CL0 and the measured limiting capacitance CL. In an example shown in FIG. 4, the degradation index (DI) of the battery is 68%, which has been submitted to 300 cycles of charge and discharge.

As has been described above, in the calculation of the degree of degradation by the battery system 1 of the embodiment, a complicated processing such as an analysis of a semicircle portion of the Nyquist plot (see FIG. 1) is unnecessary. Because of this, the battery system 1 enables a user to easily measure the degree of degradation of the battery while the battery is used.

<Methods for Manufacturing and Evaluating Battery System 1>

Figure 5:
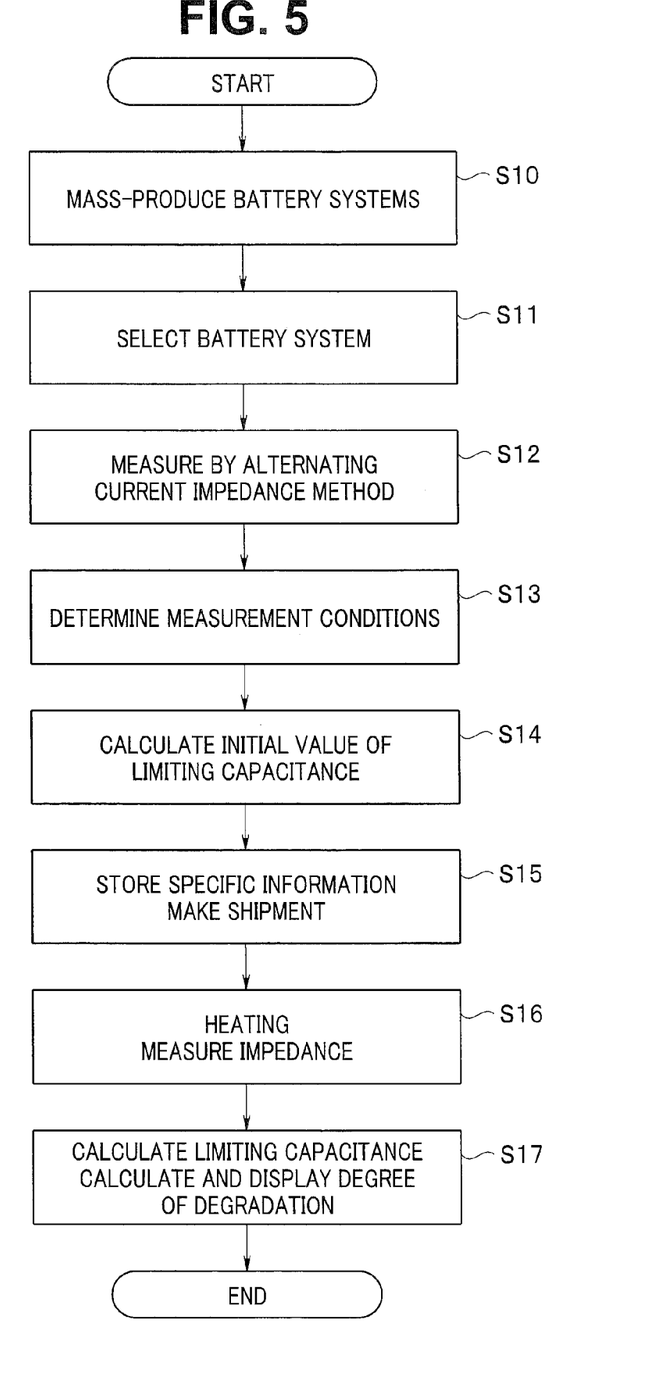
FIG. 5 is a flowchart for describing a manufacturing method and an operation of the battery system of the first embodiment.

Here, a method for evaluating a battery system 1 will be further described below with reference to a flowchart shown in FIG. 5.

<Step S10>

A large amount of battery systems 1 each having the battery 10 having a predetermined specification are manufactured. Note that specific information is not stored in a memory portion 33 in the stage.

<Step S11>

At least one battery is selected from a plurality of mass-produced batteries 10. The number of the selected batteries is preferably a plurality of batteries though depending on the production numbers, and in consideration of the variation during the production, the plurality of batteries are particularly preferably selected also from a first lot and a last lot.

<Step S12>

The battery which has been selected in Step S11 is measured by an alternating current impedance method, in a state of having been heated to a predetermined temperature of 40° C. or higher. Then, the Nyquist plot shown in FIG. 3 is acquired. Note that the measurement temperature is 40° C. to 70° C. As has been already described, in the above described temperature range or higher, the limiting capacitance can be acquired at a frequency of 0.5 mHz or more but less than 10 mHz. If the temperature is in the above described temperature range or lower, the battery is hardly broken down by heating. Furthermore, the temperature is more preferably 40° C. to lower than 60° C., from the viewpoint of ensuring long-term reliability. That is, the measurement temperature is determined in consideration of heat resistances of an electrolyte, a separator and a package.

Note that the Nyquist plot which is acquired from the battery having been submitted to one cycle of charge and discharge is unstable, and accordingly characteristics of a battery having been submitted to several cycles, for instance, three cycles are preferably determined to be initial characteristics.

<Step S13>

A frequency at which the trajectory of the impedance becomes approximately perpendicular to the Z' axis is revealed from the acquired Nyquist plot. For instance, a frequency showing an impedance Z' of 95% or more of an impedance Z' at a frequency of 1 mHz which is a lowest frequency out of the measurement frequencies is determined as the measurement frequency.

The measurement frequency is less than 10 mHz and is preferably less than 3 mHz, in order to acquire the limiting capacitance. On the other hand, when the measurement frequency is 0.5 mHz or more and is preferably 1 mHz or more, the measurement time period is practically within an allowable range. It is also acceptable to measure the capacitance at a plurality of temperatures, and determine a lowest temperature at which the trajectory of the impedance becomes approximately perpendicular to the Z' axis, as the measurement temperature.

<Step S14>

An initial limiting capacitance CL0 is calculated from a measured impedance value Z" at a measurement frequency f at the measurement temperature, according to the following (Equation 1).

$$CL0 = -1/(2\pi f Z'') \qquad \text{(Equation 1)}$$

For instance, an equation of CL0=1,860 F holds under equations of Z"=−0.0857Ω and f=1 mHz.

<Step S15>

The specific information including the initial limiting capacitance, the measurement frequency and the measurement temperature is stored in the memory portions 33 of each of the battery systems 1. Then, the battery systems are shipped. That is, the steps so far are steps at a time of manufacture.

<Step S16>

When a user measures the degree of degradation of the battery 10, after shipment, that is, after having started the use of the battery, the battery 10 is heated to the measurement temperature which is stored in the memory portion 33 of the battery system 1. A power supply section 20 stands by until the temperature of the battery 10 which is measured by a temperature measuring section 50 reaches the measurement temperature. When the temperature of the battery 10 has reached the measurement temperature, the power supply section 20 applies an alternating current signal of the measurement frequency, to the battery 10. Then, the impedance is measured by a measuring portion 32.

<Step S17>

The calculating portion 34 calculates the limiting capacitance CL of the battery 10 from the measurement frequency and the measured impedance. Furthermore, the calculating portion calculates the degree of degradation with reference to the initial limiting capacitance CL0. The calculated degree of degradation is displayed on a display portion 35.

Then, the steps S16 and S17 are repeatedly performed, as needed. Note that when the degree of degradation becomes a predetermined value or less, an alert may be displayed on the display portion 35.

As have been described above, the battery system 1 can easily evaluate the degree of degradation of the battery.

Note that the initial limiting capacitance CL0 which is stored in the memory portion 33 and the limiting capacitance CL that is calculated by the calculating portion 34 are not limited to the capacitance which is calculated by (Equation 1) and is expressed by the unit of "F". That is, the degradation index which is a ratio between the initial limiting capacitance CL0 and the measured limiting capacitance CL can be calculated, for instance, also from a ratio between an initial impedance and the measured impedance which have been measured at the same frequency. That is, it is also acceptable in the battery system 1 to regard some index which has a proportional relationship with the limiting capacitance as a limiting capacitance, store the index and acquire the index. In other words, in the battery system 1, "limiting capacitance" means "index having proportional relationship with limiting capacitance".

In addition, when a measurement method, a measurement condition or a calculation method varies, the values of the limiting capacitance occasionally vary. For instance, the "limiting capacitance" which is acquired by the battery system 1 of the embodiment does not necessarily become the same value as the limiting capacitance that is acquired at a very low frequency of 0.1 mHz or less. However, because the initial limiting capacitance CL0 and the limiting capacitance CL are measured with the same measurement method, on the same measurement condition and with the same calculation method, the reliability of the degree of degradation (degradation index) which is calculated as a ratio (limiting capacitance CL/initial limiting capacitance CL0) is assured.

<Second Embodiment>

Next, a battery system 1A of a second embodiment will be described. The battery system 1A is similar to the battery system 1, and accordingly the same components as those of the battery system 1 are designated by the same reference numerals, and the description will be omitted.

In the battery system 1A, a memory portion 33 stores a plurality of measurement frequencies; a power supply section 20 applies the plurality of measurement frequencies to the battery 10; and a calculating portion 34 calculates the limiting capacitance, by using a plurality of measured impedance values which have values of 95% or more of a measurement value of an impedance that a measuring portion 32 has measured when the power supply section 20 has applied a measurement frequency of the lowest frequency out of a plurality of measurement frequencies to the battery 10.

For instance, the battery system 1A uses four measurement frequencies of 2.00 mHz, 1.59 mHz, 1.26 mHz and 1.00 mHz. That is, the battery system 1A acquires the impedances, for instance, of the four frequencies are acquired, as are shown below.

$Z''(f=2.00\ \text{mHz})=-0.0474\Omega$ $Z''(f=1.59\ \text{mHz})=-0.0569\Omega$ $Z''(f=1.26\ \text{mHz})=-0.0697\Omega$ $Z''(f=1.00\ \text{mHz})=-0.0857\Omega$ Ratios of the impedances at each of the frequencies with respect to the impedance at f=1.00 mHz of the lowest frequency are described below.

$Z''(f=2.00\ \text{mHz})/Z''(f=1.00\ \text{mHz})\times 100=92\%$ $Z''(f=1.59\ \text{mHz})/Z''(f=1.00\ \text{mHz})\times 100=98\%$ $Z''(f=1.26\ \text{mHz})/Z''(f=1.00\ \text{mHz})\times 100=98\%$ $Z''(f=1.00\ \text{mHz})/Z''(f=1.00\ \text{mHz})\times 100=100\%$ Then, the calculating portion 34 calculates the limiting capacitance by using the three measurement values of Z''(f=1.59 mHz), Z''(f=1.26 mHz) and Z''(f=1.00 mHz) which have each a ratio of 95% or more. In other words, the Z'' (f=2.00 mHz) having a ratio of less than 95% is not used in the calculation, because it is considered to be in a range in which the trajectory of the impedance is not approximately perpendicular to the Z' axis.

Figure 6:
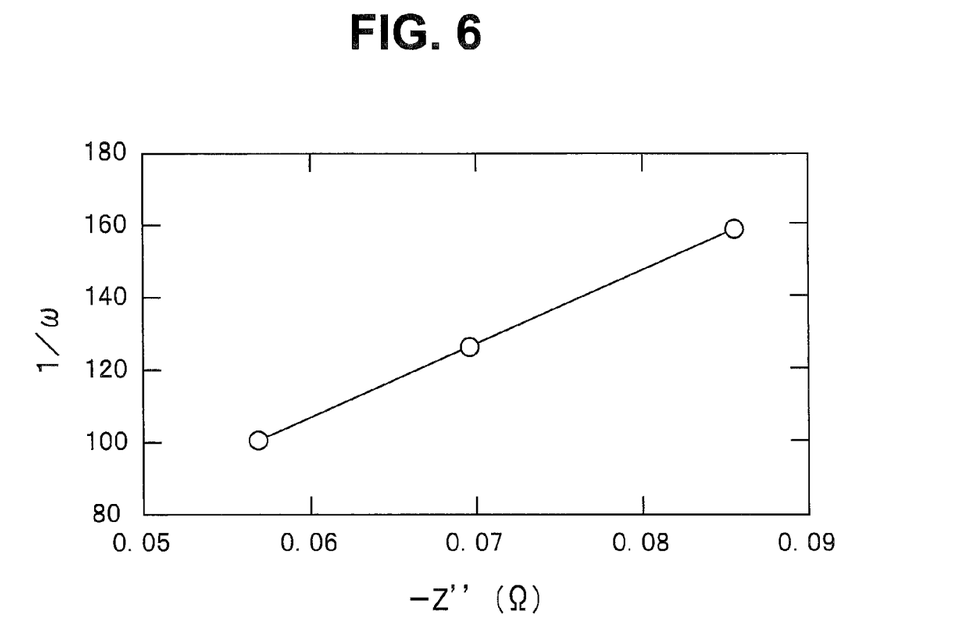
FIG. 6 is a view for describing linear approximation for calculating the limiting capacitance.

The limiting capacitance CL is calculated, for instance, from the gradient of a straight line, which is obtained in a case where a horizontal axis represents an impedance Z'', a vertical axis represents $1/\omega$ (note that $\omega=2\pi f$), and the above described three measurement values are linearly approximated, as are shown in FIG. 6. In FIG. 6, a result of CL=2040 F is obtained. Note that in the linear approximation, the straight line may be approximated by a straight line from the origin point.

In addition, the method for calculating the limiting capacitance may also be a method of calculating an average value of the limiting capacitances which have been calculated from the impedances at the respective frequencies, or the like. Furthermore, the limiting capacitance may be calculated by fitting with the use of an equivalent circuit equation for an impedance of a capacitor shown in (Equation 2).

$$Z=1/(j\omega C) \quad \text{(Equation 2)}$$

The battery system 1A of the embodiment has an effect that the battery system 1 has, and spends a longer measurement time period than that in the battery system 1, but can calculate the degree of degradation with higher accuracy.

Note that the number of the measurement frequencies is determined according to the specification of the battery system, but when the number is 2 or more, the measurement is effective, and when the number is 10 or less, the measurement time period is within an allowable range.

<Third Embodiment>

Next, a battery system 1B of a third embodiment will be described. The battery system 1B is similar to the battery systems 1 and 1A, and accordingly the same components as those of the battery systems 1 and 1A are designated by the same reference numerals, and the description will be omitted.

In some batteries 10, when a state of charge SOC varies, a value of the limiting capacitance which is acquired by an alternating current impedance method occasionally varies. The battery system 1 measures and stores the initial limiting capacitance CL0, for instance, in a case of SOC≈100%, measures a capacitance in the state of SOC≈400% (direct-current component=4.2 V), and thereby calculates a degree of degradation.

Figure 7:
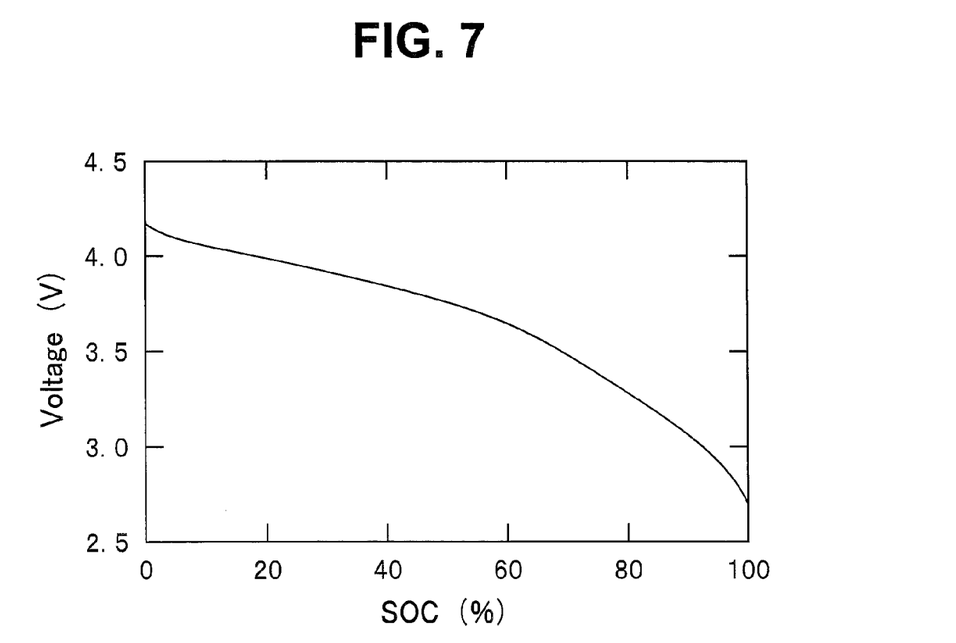
FIG. 7 is a view showing a relationship between a state of charge and a voltage.
Figure 8:
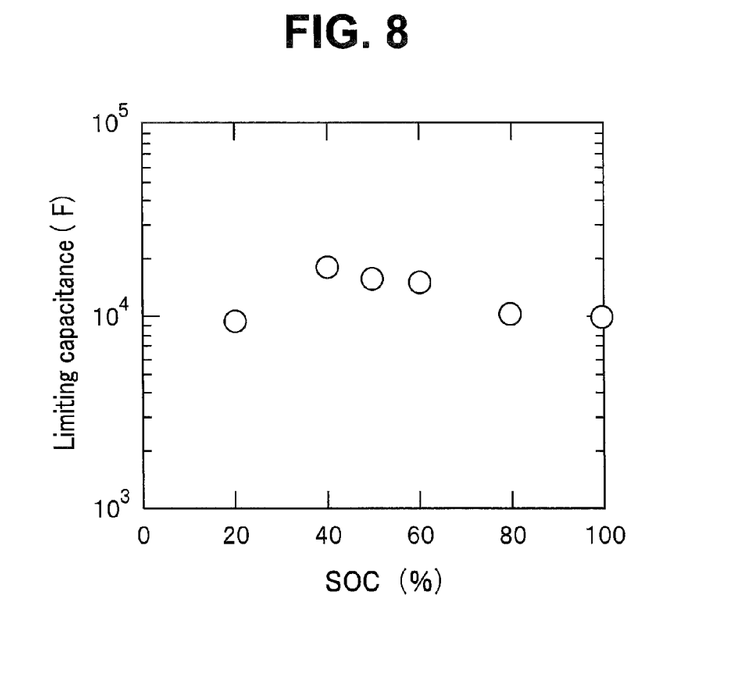
FIG. 8 is a view showing a relationship between the state of charge and the limiting capacitance.

On the other hand, in the battery system 1B, a memory portion 33 stores a relationship between a state of charge SOC and a voltage and a relationship between the state of charge SOC and the initial limiting capacitance CLO in an initial battery, which are shown in FIG. 7 and FIG. 8, respectively.

Then, the control section 30 measures an impedance while using the voltage of the battery indicated immediately before the measurement for acquiring the degree of degradation, as a reference. A calculating portion 34 determines the state of charge SOC from the voltage of the battery, and calculates the degree of degradation by using the initial limiting capacitance CL0 corresponding to the state of charge SOC.

The battery system 1B of the present embodiment has an effect which the battery systems 1 and 1A have, and can calculate the degree of degradation with higher accuracy.

<Fourth Embodiment>

Next, a battery system 1C of a fourth embodiment will be described. The battery system 1C is similar to the battery systems 1 to 1B, and accordingly the same components as those of the battery systems 1 to 1B are designated by the same reference numerals, and the description will be omitted.

Figure 9:
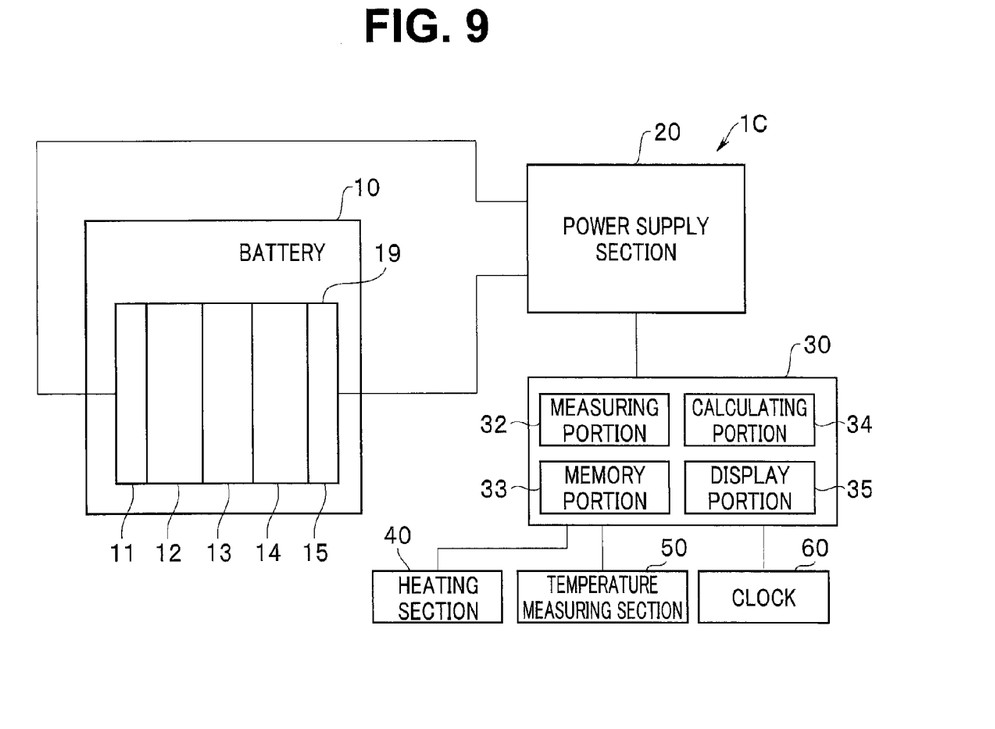
FIG. 9 is a configuration diagram of a battery system of a fourth embodiment.

As shown in FIG. 9, the battery system 1C further includes a clock 60 which measures a time period. Note that in a case, for example, where the battery system 1C is used as a part of another system, when data of a clock of another system can be used, the clock 60 which functions as a dedicated component member is unnecessary.

A memory portion 33 stores the degree of degradation, which a calculating portion 34 has calculated, and a time period of use of the battery 10, which is obtained on the basis of the data of the clock 60. Here, the time period of use is a time period after the battery 10 has been regularly charged and discharged and the degradation has been progressing, specifically, a time period after a user has started the use of the battery 10.

Figure 10:
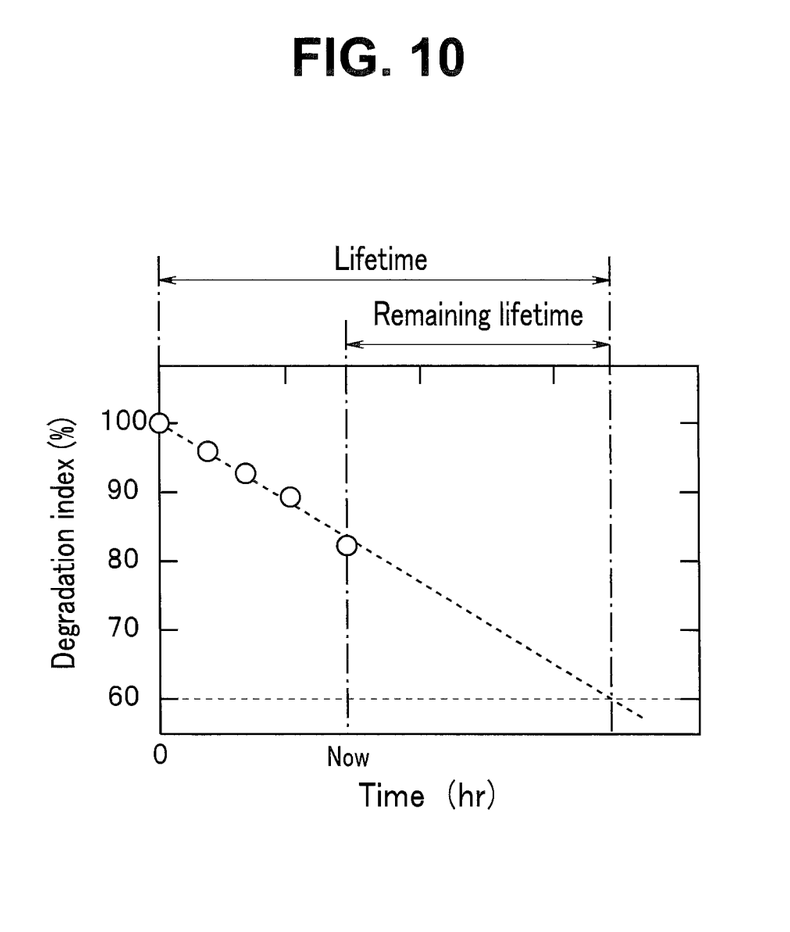
FIG. 10 is a view for describing a change with time of the degradation index of the battery.

As is shown in FIG. 10, the degree of degradation of the battery 10 decreases along with the time period of use (number of charge and discharge cycles). Then, when a degradation index (limiting capacitance CL/initial limiting capacitance CL0) reaches 60%, for instance, it is preferable to replace the battery with a new battery.

In the battery system 1C, the calculating portion 34 calculates a remaining lifetime of the battery, on the basis of the time period of use and the degradation, which are stored in the memory portion 33. For instance, as is shown in FIG. 10, the calculating portion 34 calculates the remaining lifetime by extrapolating a change of the degree of degradation with time. The calculated remaining lifetime is displayed together with the degree of degradation, on a display portion 35.

The battery system 1C has an effect of the battery system 1 and the like, and can further calculate the remaining lifetime of the battery, which is useful information for a user. Note that the lifetime of the battery 10 greatly varies depending on a frequency of use (frequency of charge and discharge). However, the battery system 1C calculates the remaining lifetime, on the basis of a usage state of the battery 10. Because of this, accurate information can be acquired.

Note that in the battery systems 1B and 1C as well, the degree of degradation may be calculated using a plurality of measurement frequencies, similarly to the battery system 1A.

In addition, in the above description, the battery systems have been described while a lithium ion secondary battery is taken as an example, but the battery 10 may be various types of secondary batteries.

That is, the present invention is not limited to the above described embodiments, and various modifications and alterations, for instance, a combination of the components of the embodiments, can be made within the range without departing from the gist of the present invention.

The present application claims the benefit of Japanese Patent Application No. 2012-223124, filed in Japan on Oct. 5, 2012, the contents of which are incorporated in the specification, claims, and drawings of the present application.

The invention claimed is:

1. A battery system comprising:
a secondary battery, a degree of degradation of which is measured;
a memory portion configured to store specific information including: a measurement frequency, a measurement temperature, and an initial limiting capacitance of one secondary battery having a same specification as a specification of the secondary battery;
a temperature measuring section configured to measure a temperature of the secondary battery;
a power supply section configured to apply an alternating current signal having the measurement frequency of 1 mHz or more but less than 3 mHz, to the secondary battery at the measurement temperature of 40° C. or higher but 70° C. or lower, based on the specific information in the memory portion;
a measuring portion configured to measure an impedance of the secondary battery by the alternating current signal that the power supply section applies;
a calculating portion configured to calculate the degree of degradation by using a limiting capacitance of the secondary battery, which is calculated using a measurement value of the measuring portion, and the initial limiting capacitance; and
a heating section configured to heat the secondary battery to the measurement temperature,
wherein the memory portion is configured to store the measurement frequency in plurality,
wherein the power supply section is configured to apply the plurality of measurement frequencies to the secondary battery, wherein the calculating portion is configured to calculate the limiting capacitance by using a plurality of measurement values at the plurality of measurement frequencies, and wherein the calculating portion is configured to calculate the limiting capacitance by using a measurement value which is 95% or more of a measurement value at a lowest frequency out of the plurality of measurement frequencies.

2. The battery system according to claim 1, wherein the specific information includes information on a voltage dependent on a state of charge and information on the initial limiting capacitance dependent on a state of charge, and wherein the calculating portion is configured to use the initial limiting capacitance according to the state of charge.

3. The battery system according to claim 1, further comprising a clock, wherein the memory portion is configured to store the degree of degradation calculated by the calculating portion, and a time period of use of the battery, and wherein the calculating portion is configured to calculate a remaining lifetime of the battery, based on the degree of degradation and the time period of use.

4. The battery system according to claim 1, wherein the secondary battery is a lithium ion secondary battery.

5. A method for evaluating a battery system comprising steps of:

manufacturing a plurality of battery systems which are provided with secondary batteries, respectively;

measuring an initial limiting capacitance of one of the secondary batteries, at a measurement temperature of 40° C. or higher but 70° C. or lower;

storing specific information which includes a measurement frequency, the measurement temperature and the initial limiting capacitance, in a memory portion of the battery system;

heating the secondary battery of the battery system to the measurement temperature;

applying an alternating current signal having the measurement frequency of 0.5 mHz or more but less than 10 mHz, to the secondary battery at the measurement temperature, and measuring an impedance of the secondary battery; and calculating a degree of degradation by using a limiting capacitance of the secondary battery, which is calculated using the impedance, and the initial limiting capacitance.

* * * * *